(12) United States Patent
Schapendonk et al.

(10) Patent No.: US 11,750,205 B1
(45) Date of Patent: Sep. 5, 2023

(54) CURRENT DIGITAL-TO-ANALOG CONVERTER WITH DISTRIBUTED RECONSTRUCTION FILTERING

(71) Applicant: NXP B.V., Eindhoven (NL)

(72) Inventors: Edwin Schapendonk, Brabant (NL); Costantino Ligouras, Utrecht (NL); Harry Neuteboom, Eindhoven (NL); Sergio Andrés Rueda Gómez, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/717,386

(22) Filed: Apr. 11, 2022

(51) Int. Cl.
 *H03M 1/06* (2006.01)
 *H03M 1/44* (2006.01)
(52) U.S. Cl.
 CPC ....... *H03M 1/0663* (2013.01); *H03M 1/0614* (2013.01); *H03M 1/447* (2013.01)
(58) Field of Classification Search
 CPC .................................. H03M 1/06; H03M 1/44
 See application file for complete search history.

(56) References Cited

U.S. PATENT DOCUMENTS

| | | | | |
|---|---|---|---|---|
| 6,411,232 B1 * | 6/2002 | Miller | ................... | H03M 3/386 |
| | | | | 341/172 |
| 6,417,793 B1 | 7/2002 | Bugeja et al. | | |
| 6,507,296 B1 * | 1/2003 | Lee | ..................... | H03M 1/1004 |
| | | | | 341/120 |
| 8,514,012 B2 | 8/2013 | Splithof et al. | | |
| 8,537,107 B1 * | 9/2013 | Li | .......................... | G06F 3/023 |
| | | | | 345/173 |
| 8,736,476 B2 | 5/2014 | Gong et al. | | |
| 9,258,001 B1 * | 2/2016 | Das | ........................ | H03L 7/093 |
| 9,648,414 B1 * | 5/2017 | Das | ........................ | H03G 3/348 |
| 10,218,343 B1 * | 2/2019 | Tomar | .................... | G11C 7/222 |
| 10,833,699 B1 | 11/2020 | Maheswaran | | |
| 11,144,316 B1 * | 10/2021 | Far | ........................ | H03M 1/742 |
| 2004/0130473 A1 * | 7/2004 | Snoeijs | ................. | G11C 27/026 |
| | | | | 341/158 |
| 2005/0225464 A1 * | 10/2005 | Lin | ...................... | H03M 1/0614 |
| | | | | 341/144 |
| 2009/0230874 A1 * | 9/2009 | Zhao | ..................... | H05B 45/347 |
| | | | | 315/192 |
| 2009/0230891 A1 * | 9/2009 | Zhao | ..................... | H05B 45/46 |
| | | | | 315/308 |

(Continued)

*Primary Examiner* — Lam T Mai

(57) ABSTRACT

A method for digital-to-analog signal conversion with distributed reconstructive filtering includes receiving a digital code synchronous to a clock signal having a first frequency, determining next states of a plurality of digital-to-analog current elements based on the digital code, combining a plurality of currents to generate an output current, and generating the plurality of currents. Each of the plurality of currents is based on a corresponding control signal of a plurality of control signals. The method includes generating the plurality of control signals based on the next states of the plurality of digital-to-analog current elements. Each of the plurality of control signals selects a first voltage level, a second voltage level, or a transitioning voltage level for use by a corresponding digital-to-analog current element. The transitioning voltage level linearly transitions from the first voltage level to the second voltage level over a predetermined number of periods of the clock signal.

20 Claims, 10 Drawing Sheets

(56) References Cited

U.S. PATENT DOCUMENTS

| | | | |
|---|---|---|---|
| 2009/0261999 A1* | 10/2009 | Ramaswami | H03M 1/1095 341/120 |
| 2009/0273288 A1* | 11/2009 | Zhao | H05B 45/38 315/185 R |
| 2010/0026203 A1* | 2/2010 | Zhao | H05B 45/20 315/291 |
| 2010/0141496 A1* | 6/2010 | Takiguchi | H03M 1/0604 341/144 |
| 2010/0156315 A1* | 6/2010 | Zhao | H05B 45/3725 315/294 |
| 2010/0182180 A1* | 7/2010 | Ikoma | H03M 1/0604 341/144 |
| 2010/0194308 A1* | 8/2010 | Zhao | H05B 45/46 315/297 |
| 2011/0012692 A1* | 1/2011 | Mirzaei | H03H 7/12 333/172 |
| 2011/0193605 A1* | 8/2011 | Zhao | H05B 45/37 327/175 |
| 2011/0241635 A1* | 10/2011 | Yamahira | H03K 19/00361 323/271 |
| 2012/0188107 A1* | 7/2012 | Ashburn, Jr. | H03M 3/344 341/110 |
| 2012/0249013 A1* | 10/2012 | Valois | H05B 45/18 315/291 |
| 2014/0266824 A1* | 9/2014 | Lowney | H03M 1/1009 341/120 |
| 2014/0266831 A1 | 9/2014 | Chou et al. | |
| 2015/0061908 A1* | 3/2015 | Rajasekhar | H03M 1/0678 307/115 |
| 2017/0359077 A1* | 12/2017 | Dempsey | H03M 1/08 |
| 2018/0012553 A1* | 1/2018 | Kim | G09G 3/3614 |
| 2021/0266001 A1* | 8/2021 | Kinyua | H03F 3/303 |
| 2022/0066489 A1* | 3/2022 | Iroaga | G05F 1/575 |
| 2023/0138391 A1* | 5/2023 | Saito | H04N 23/45 341/120 |

* cited by examiner

CURRENT DIGITAL-TO-ANALOG CONVERTER WITH DISTRIBUTED RECONSTRUCTION FILTERING

BACKGROUND

Field of the Invention

This invention relates to integrated circuits and more particularly to integrated circuits including digital-to-analog converters.

Description of the Related Art

In general, digital-to-analog converters (DACs) are used to convert digitally processed signals into analog signals. A conventional DAC generates an analog output signal having a wide frequency spectrum with components around multiples of the frequency of the clock signal used to control the DAC. High frequency components around multiples of the frequency of the clock signal can interfere with other signals and degrade performance of a system including the DAC. Conventional techniques for suppressing the high frequency components include interpolating a digital input signal provided to the DAC or low-pass filtering the analog output signal generated by the DAC. The additional filtering of the digital input signal or analog output signal of a DAC increases area or power consumption of a system including the DAC and can degrade other system parameters, e.g., output impedance, offset, and linearity. For example, a passive reconstruction filter that suppresses high frequency harmonics in the analog output signal generated by a DAC increases the output impedance of the DAC. An active filter that suppresses the high frequency harmonics in the analog output signal introduces an offset into the analog output signal or increases non-linearity of the system response. Interpolating the digital input signal provided to the DAC to suppress high frequency signals increases the DAC update rate, thus requiring the DAC to operate at a higher frequency (e.g., requiring a higher frequency clock signal), which might not be possible in some systems. Accordingly, improved techniques for suppressing high frequency harmonics in the analog output signal generated by a DAC are desired.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates similar or identical items.

DETAILED DESCRIPTION

Figure 1:
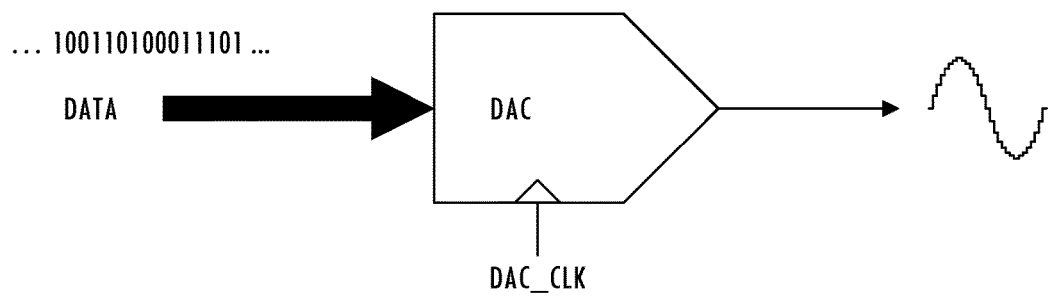
FIG. 1 illustrates a functional block diagram of a DAC.
Figure 2:
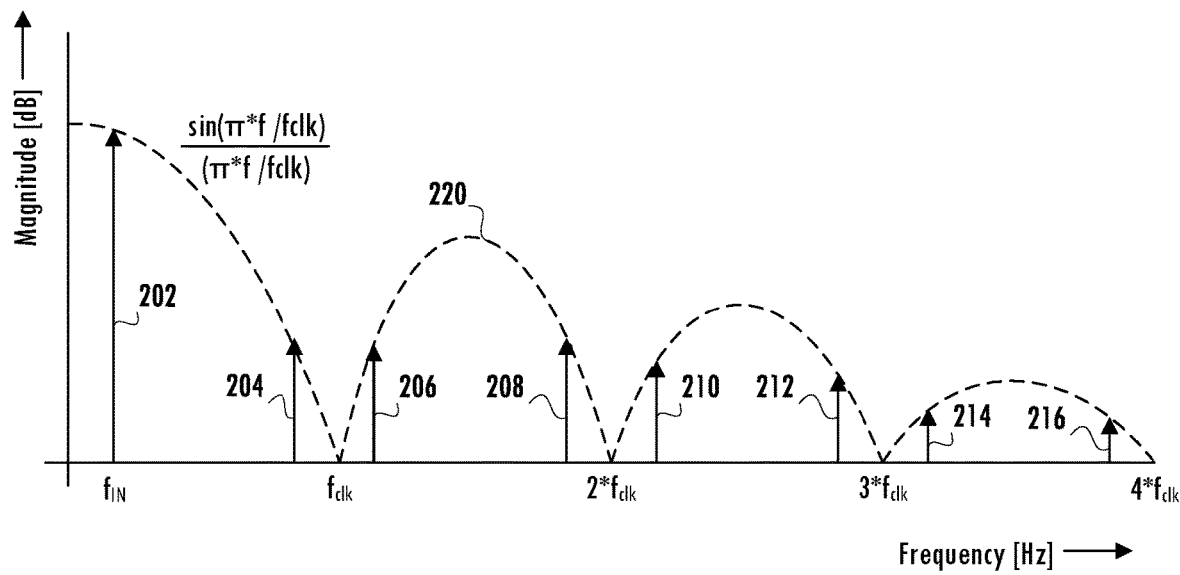
FIG. 2 illustrates magnitude as a function of frequency of the analog output signal generated by the DAC of FIG. 1.

Referring to FIGS. 1 and 2, in an exemplary communications application, a conventional current DAC converts a digital input signal into an analog output signal without any filtering. The spectrum of the analog output signal includes a desired baseband signal (signal 202) having frequency $f_{IN}$ in addition to undesirable images (signals 204, 206, . . . , 216) around multiples of frequency $f_{CLK}$ of clock signal DAC_CLK. The magnitudes of these image signals are defined by the envelope function $\sin(\pi \times f/f_{CLK})/(\pi \times f/f_{CLK})$. In some applications, the image signals are large enough to degrade performance of the system including the DAC and need suppression. As discussed above, conventional techniques for suppressing the image signals include insertion of an interpolation filter in front of the DAC and increasing the frequency of clock signal DAC_CLK. This will change the envelope function and attenuate the image signals because the ratio between the frequency of clock signal DAC_CLK and the baseband signal frequency increases. However, a higher frequency of clock signal DAC_CLK is not always available and can increase power consumption of the system. Another technique for reducing the magnitude of the images is to insert an analog reconstruction filter at the output of the DAC. If the reconstruction filter is a passive filter, then the output impedance of the DAC increases. If the reconstruction filter is an active filter, then the reconstruction filter adds offset and non-linearity to the system.

Figure 3:
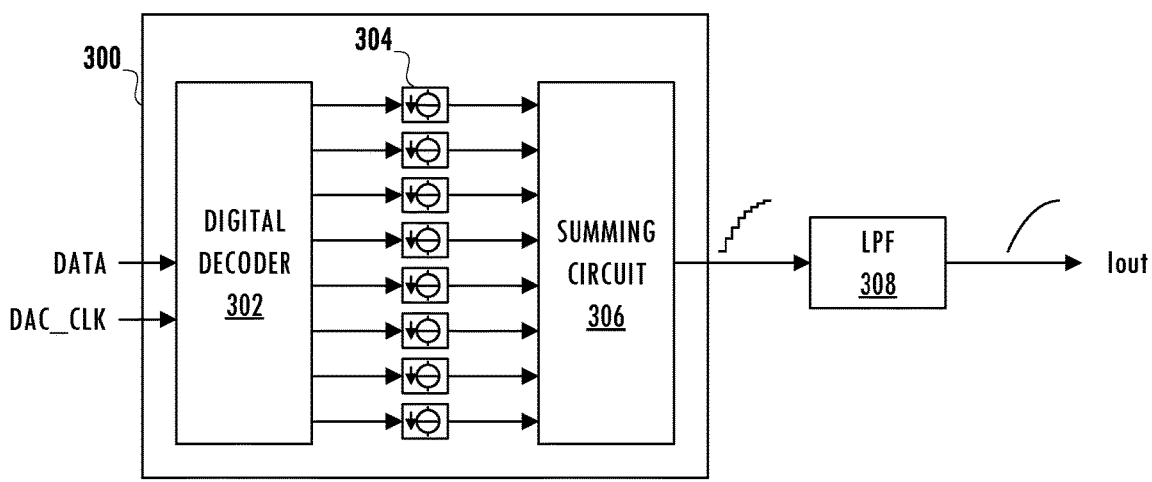
FIG. 3 illustrates a functional block diagram of a reconstruction filter coupled to the output of a current DAC.

FIG. 3 illustrates a block diagram of a 3-bit segmented current DAC. The weight of the contribution to the output current $I_{OUT}$ provided by each of the eight DAC elements 304 is the same and is controlled by digital decoder 302. Summing circuit 306 combines those contributions and provides the output current of DAC 300 to low-pass filter 308, which generates analog output signal $I_{OUT}$. Since summing the individual currents and low-pass filtering are both linear functions, the order in which these operations are performed can be changed without changing the overall transfer function. Therefore, the reconstruction filtering can be performed on each of the inputs to the summing circuit without substantially affecting the analog output signal.

Figure 4:
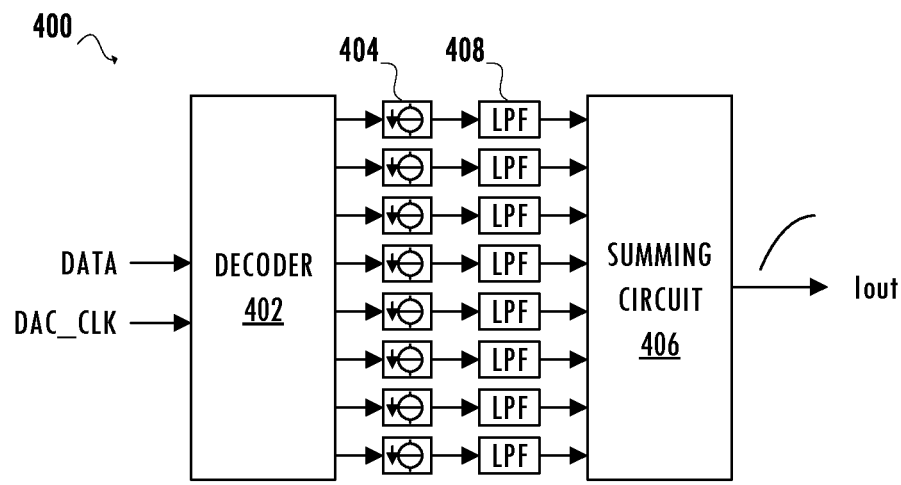
FIG. 4 illustrates a functional block diagram of a current DAC with distributed reconstruction filtering consistent with at least one embodiment of the invention.

A current DAC with distributed reconstruction filtering generates an analog output signal from a digital input code and limits the bandwidth of the analog output signal to a maximum frequency of the digital input signal (e.g., to reduce noise and interference in target applications). In a target communications application, the DAC with distributed reconstruction filtering outputs sinusoidal signals based on a sequence of samples of digital code DATA. Referring to FIG. 4, rather than inserting an interpolation filter in the signal path before the DAC or inserting a reconstruction filter in the signal path after the DAC, current DAC with distributed reconstruction filtering 400 attenuates high frequency components of the output current signal during the digital-to-analog conversion. In at least one embodiment of current DAC with distributed reconstruction filtering 400, low-pass filter elements 408 are distributed over and coupled to corresponding DAC elements 404.

Digital decoder 402 receives digital code DATA synchronously to clock signal DAC_CLK and provides control signals to each of the eight DAC elements 404. Low-pass filter elements 408 suppress the high frequency signals in the currents generated by DAC elements 404 before being combined by summing circuit 406 to generate analog output signal $I_{OUT}$, which has a current level corresponding to the value of digital code DATA. In at least one embodiment, summing circuit 406 is a summing node, although more complex circuits may be used.

Figure 5:
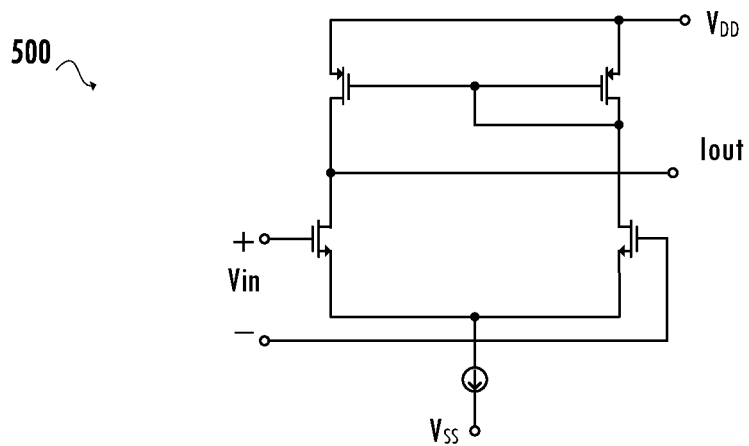
FIG. 5 illustrates a circuit diagram of an exemplary DAC element for use in an embodiment of a current DAC with distributed reconstruction filtering of FIG. 4 consistent with at least one embodiment of the invention.
Figure 6:
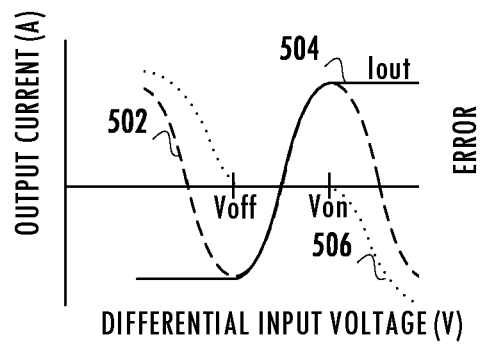
FIG. 6 illustrates waveforms for an output current as a function of input voltage for the exemplary DAC element of FIG. 5.
Figure 7:
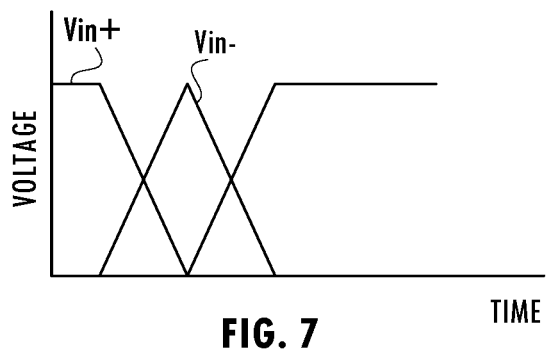
FIG. 7 illustrates waveforms for a differential input voltage as a function of time for the exemplary DAC element of FIG. 5.
Figure 8:
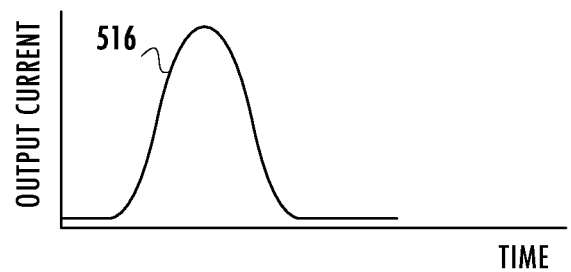
FIG. 8 illustrates a waveform for the impulse response of the exemplary DAC element of FIG. 5.
Figure 9:
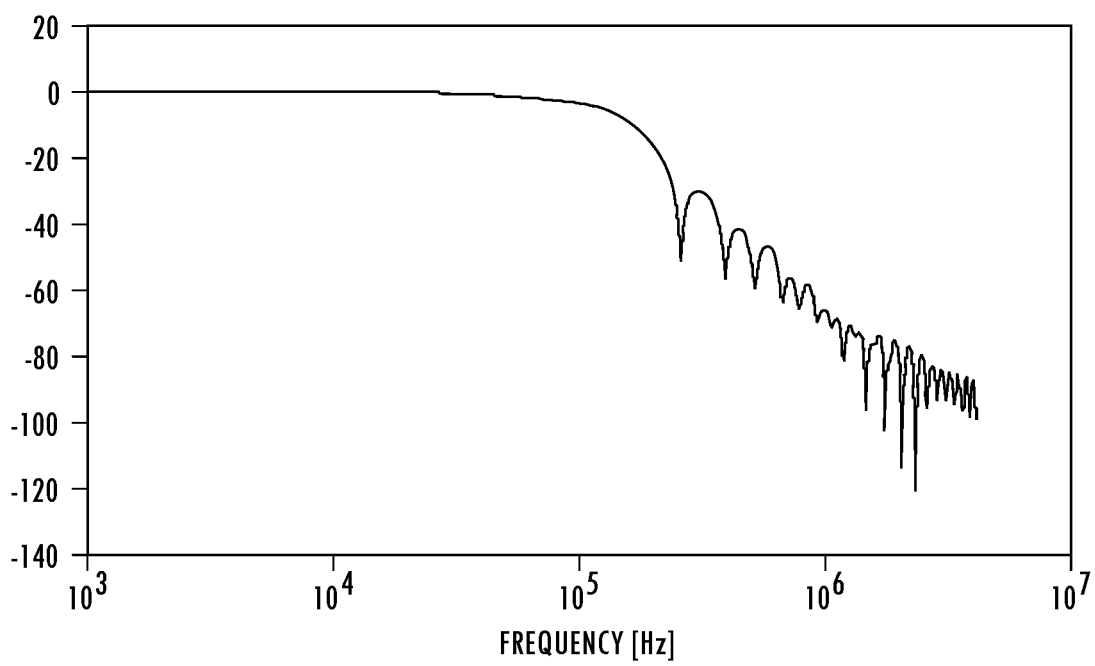
FIG. 9 illustrates a waveform of a normalized frequency response of an exemplary DAC element of a current DAC with distributed reconstruction filter consistent with at least one embodiment of the invention.
Figure 10:
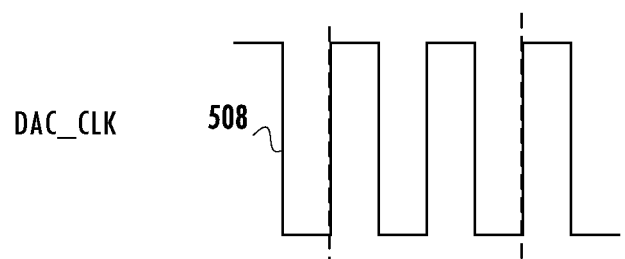
FIG. 10 illustrates a waveform of a clock signal input used to control the current DAC with distributed reconstruction filtering of FIG. 4.
Figure 11:
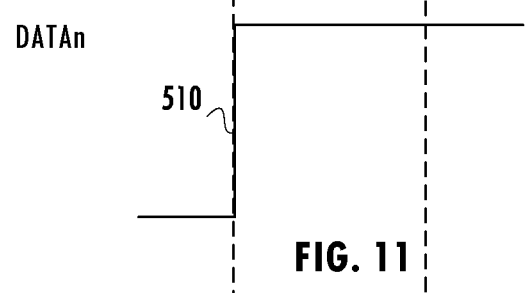
FIG. 11 illustrates a waveform of a bit of the digital input signal used to generate an input to a DAC element of FIG. 5.
Figure 12:
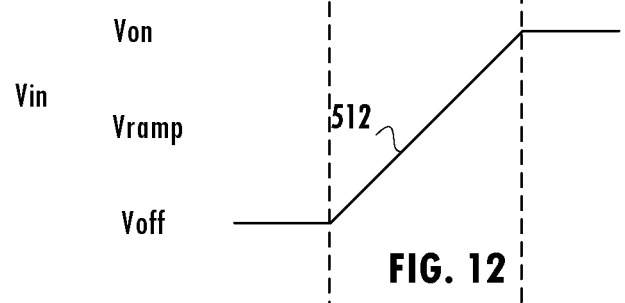
FIG. 12 illustrates a waveform of a linearly transitioning voltage provided to the exemplary DAC element of FIG. 5.
Figure 13:
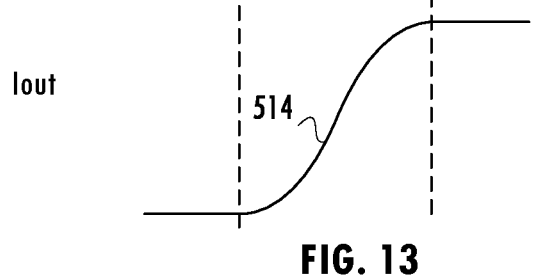
FIG. 13 illustrates a waveform of an analog output signal generated by the exemplary DAC element of FIG. 5.

In at least one embodiment of a current DAC with distributed reconstruction filtering, each DAC element combines the current digital-to-analog conversion and the low-pass filtering functions. Each DAC element includes an amplifier (e.g., differential amplifier 500 of FIG. 5) coupled to a bias circuit that generates a bias signal for the DAC element. The combined circuit provides low-pass filtering. In an exemplary embodiment, the low-pass filtering introduces notches in the frequency response at $f_{CLK}$, the frequency of clock signal DAC_CLK, and at harmonics of $f_{CLK}$, similarly to the sinusoidal step response of the waveform in FIG. 2. FIG. 6 compares the output of a DAC element including differential amplifier 500 to a sinusoidal response. Waveform 502 is an ideal sinewave, waveform 504 is the output current $I_{OUT}$, and waveform 506 illustrates the error between the ideal sinewave and the output current $I_{OUT}$. By applying a linearly transitioning voltage at the input of differential amplifier 500 when a DAC element changes state (e.g., from an off-state to an on-state), differential amplifier 500 approximates a sinusoidal output current in response to changes in state of the DAC element. When the DAC element does not change state (e.g., stays on or stays off), the input of the differential amplifier receives a predetermined voltage level (e.g., predetermined voltage $V_{ON}$ or predetermined voltage $V_{OFF}$). In an embodiment, the filtering has an impulse response that is one period of a raised cosine function with a duration of two periods of clock signal DAC_CLK, illustrated by differential input Vin+ and Vin− of FIG. 7 and output current as a function of time (waveform 516) of FIG. 8. FIG. 9 illustrates the same impulse response in the frequency domain. The notches of the filter attenuate the signal, e.g., the first notch suppresses the signal by over 50 dB at the frequency of clock signal DAC_CLK and additional notches attenuate the signal further at harmonics of the frequency of clock signal DAC_CLK.

Referring to FIGS. 10-13, in at least one embodiment, the ramp voltage and the differential pair of input devices behave like a sinc filter, e.g., function like a $\text{sinc}^2$ filter at the output of the DAC. The $\text{sinc}^2$ filtering introduces notches at $2 \times f_{CLK}$, therefore, current DAC with distributed reconstruction filtering 400 needs to operate two times slower to realize notches at clock signal DAC_CLK. That is, the position of the notches is programmable as a function of the number of periods of clock signal DAC_CLK and the notches are realized at multiples of the frequency of clock signal DAC_CLK if the number of periods is two. The duration of linearly transitioning voltage $V_{RAMP}$ between a first predetermined voltage level (e.g., predetermined voltage level $V_{OFF}$) and a second predetermined voltage level (e.g., predetermined voltage level $V_{ON}$) is equal to a predetermined number of periods (e.g., two periods) of clock signal DAC_CLK, thereby positioning a notch of the filter at the frequency of clock signal DAC_CLK. For example, waveform 510 illustrates the transition of a bit of digital code DATA$_n$ from a low signal level to a high signal level synchronously to an edge of waveform 508, which corresponds to clock signal DAC_CLK. Waveform 512 illustrates a corresponding differential voltage $V_{IN}$ at the input of differential amplifier 500 transitioning from a first predetermined level (e.g., predetermined voltage level $V_{OFF}$) to a second predetermined level (e.g., predetermined voltage level $V_{ON}$) with a portion of the input voltage $V_{IN}$ transitioning linearly over two cycles of clock signal DAC_CLK. Differential amplifier 500 generates output current $I_{OUT}$ having a corresponding waveform 514.

Referring to FIGS. 14-17, in at least one embodiment of a current DAC with distributed reconstruction filtering, digital decoder 1202 guarantees that a change in state of a DAC element (e.g., switches from an off-state to an on-state) is associated with a linearly transitioning voltage of the input voltage signal that transitions over two periods of clock signal DAC_CLK and that a DAC element that has just changed state (e.g., switched from the off-state to the on-state at time n) remains in the new state (e.g., remains in the on-state) for at least two periods of clock signal DAC_CLK before changing state again (e.g., before being switched to the off-state again). In at least one embodiment of a current DAC with distributed reconstruction filtering, digital decoder 1202 selects a predetermined voltage level (e.g., predetermined voltage $V_{ON}$ or predetermined voltage $V_{OFF}$) as the signal used by a DAC element 1208 when the DAC element remains in a state after being in the state for the predetermined number of periods of clock signal DAC_CLK.

In at least one embodiment, to guarantee that DAC elements 1208 remain in a state for at least two periods of clock signal DAC_CLK, digital decoder 1202 uses two pointers to the DAC elements to determine next states of the DAC elements and generate corresponding control signals to be provided as an input to respective DAC elements. In an embodiment, indications of the state of each of the DAC elements are stored in a register or other storage element in digital decoder 1202. For example, digital decoder 1202 updates pointer P1 based on odd samples of digital code DATA (e.g., DATA$_{n+1}$, DATA$_{n+3}$, DATA$_{n+5}$, . . . ) and updates pointer P2 based on even samples of digital code DATA (e.g., DATA$_n$, DATA$_{n+2}$, DATA$_{n+4}$, . . . ). When pointer P1 is greater than pointer P2, DAC elements indexed between pointer P1 and pointer P2 are in an on-state (as indicated by shading in FIGS. 15 and 16) and all other DAC elements are in an off-state (as indicated by the absence of shading in FIGS. 15 and 16). Referring to digital decoder 1202 increases pointer P1 in response to an odd sample being greater than an immediately prior even sample. Accordingly, the number of elements between pointer P1 and pointer P2 increases. If the next even sample is also greater than the immediately prior odd sample, then digital decoder 1202 decreases pointer P2, thereby changing the state of one or more DAC elements (e.g., turning on one or more additional DAC elements). When a pointer reaches the maximum value or the minimum value, digital decoder 1202 causes the pointer to wrap around, thereby implementing modulo arithmetic. When pointer P2 is greater than pointer P1 all elements between the pointers are in an off-state and all other elements are in an on-state.

If the digital code DATA corresponds to a signal having a frequency that is at most half the frequency of clock signal DAC_CLK, the use of pointers P1 and pointer P2 controlled by digital decoder 1202, as described above, guarantees that a DAC element that has just been switched on is not switched off in the next clock cycle. An advantage of digital decoder 1202 using pointers P1 and pointer P2 to determine the next states of the DAC elements as described above is that different DAC elements can be used for the same input value where digital code DATA keeps changing, thus averaging out the effects of differences between DAC elements caused by manufacturing mismatch. In at least one embodiment, static values of digital code DATA also use different DAC elements if digital decoder 1202 adds a random value to pointer P1 and pointer P2 and keeps the difference between the pointer values static to generate the same output level.

Figure 16:
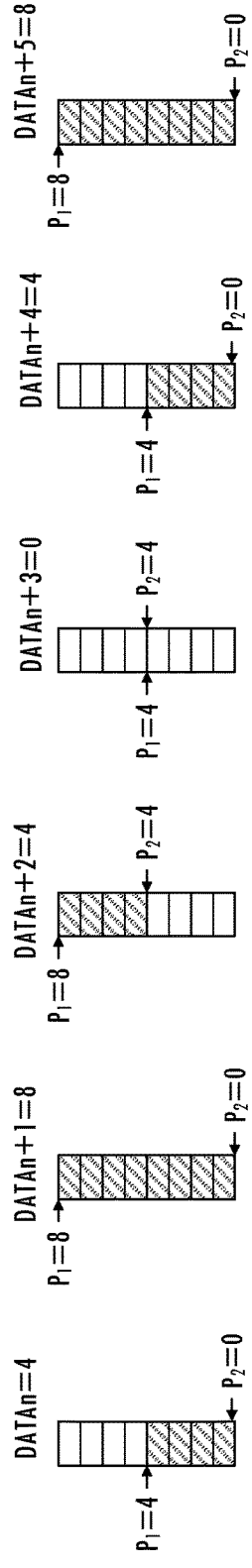
Figure 17:
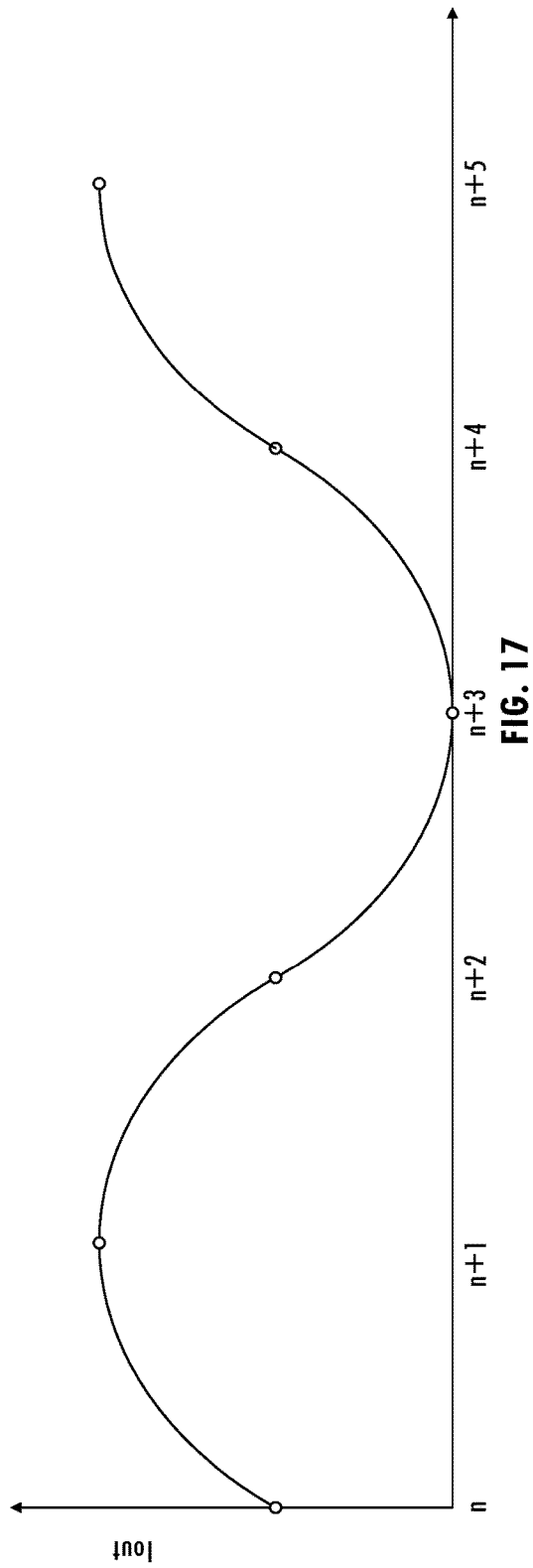
FIG. 17 illustrates a waveform of an analog output signal generated by the exemplary current DAC with distributed reconstruction filtering of FIG. 14 for the data sequence of FIG. 16 consistent with at least one embodiment of the invention.

In at least one application of a current DAC with distributed reconstruction filtering, digital code DATA corresponds to a signal having a frequency that is at most 0.25 times the frequency of clock signal DAC_CLK for digital code DATA having three bits and a DAC including eight DAC elements (although other numbers of bits and DAC elements may be used). Referring to FIGS. 16 and 17, digital code DATA has a maximum frequency of 0.25 times the frequency of clock signal DAC_CLK and each DAC element is in an on-state or in an off-state for at least two consecutive periods of clock signal DAC_CLK. When the nth sample of digital code DATA (e.g., an even indexed sample in a sequence of the digital codes) equals four, pointer P1 points to the fourth DAC element and pointer P2 points to the zeroth DAC element. All DAC elements between the index values are in an on-state and all other DAC elements are in an off-state. When digital code DATA$_{n+1}$ (e.g., a next, odd indexed digital code) equals eight, the next odd sample is greater than the immediately prior even sample and digital decoder 1202 increases pointer P1 by four to determine the next states of the DAC elements. Accordingly, all DAC elements between the index to the zeroth element and the index to the eighth element are in an on-state.

When digital code DATA$_{11}$+$_2$ (e.g., an even indexed digital code) equals four, the next even sample is less than the immediately prior odd sample and digital decoder 1202 increases pointer P2 by four to determine the next states of the DAC elements. Accordingly, all DAC elements between the index to the fourth element and the index to the eighth element are in an on-state and all other DAC elements are in an off-state. When digital code DATA$_{n+3}$ (e.g., an odd indexed digital code) equals zero, the next odd sample is less than the immediately prior even sample and digital decoder 1202 decreases pointer P1 by four to determine the next states of the DAC elements. Pointer P1 equals pointer P2, and all DAC elements are in an off-state. When digital code DATA$_{n+4}$ (e.g., an even indexed digital code) equals four, the next even sample is greater than the immediately prior odd sample and digital decoder 1202 decreases pointer P2 by four to determine the next states of the DAC elements. Accordingly, all DAC elements between the index to the zeroth element and the fourth element are in an on-state and all other DAC elements are off. When digital code DATA$_{n+5}$ (e.g., an odd indexed digital code) equals eight, the next odd sample is greater than the immediately prior even sample and digital decoder 1202 increases pointer P1 by four to determine the next states of the DAC elements. Accordingly, all DAC elements are in an on-state.

Figure 14:
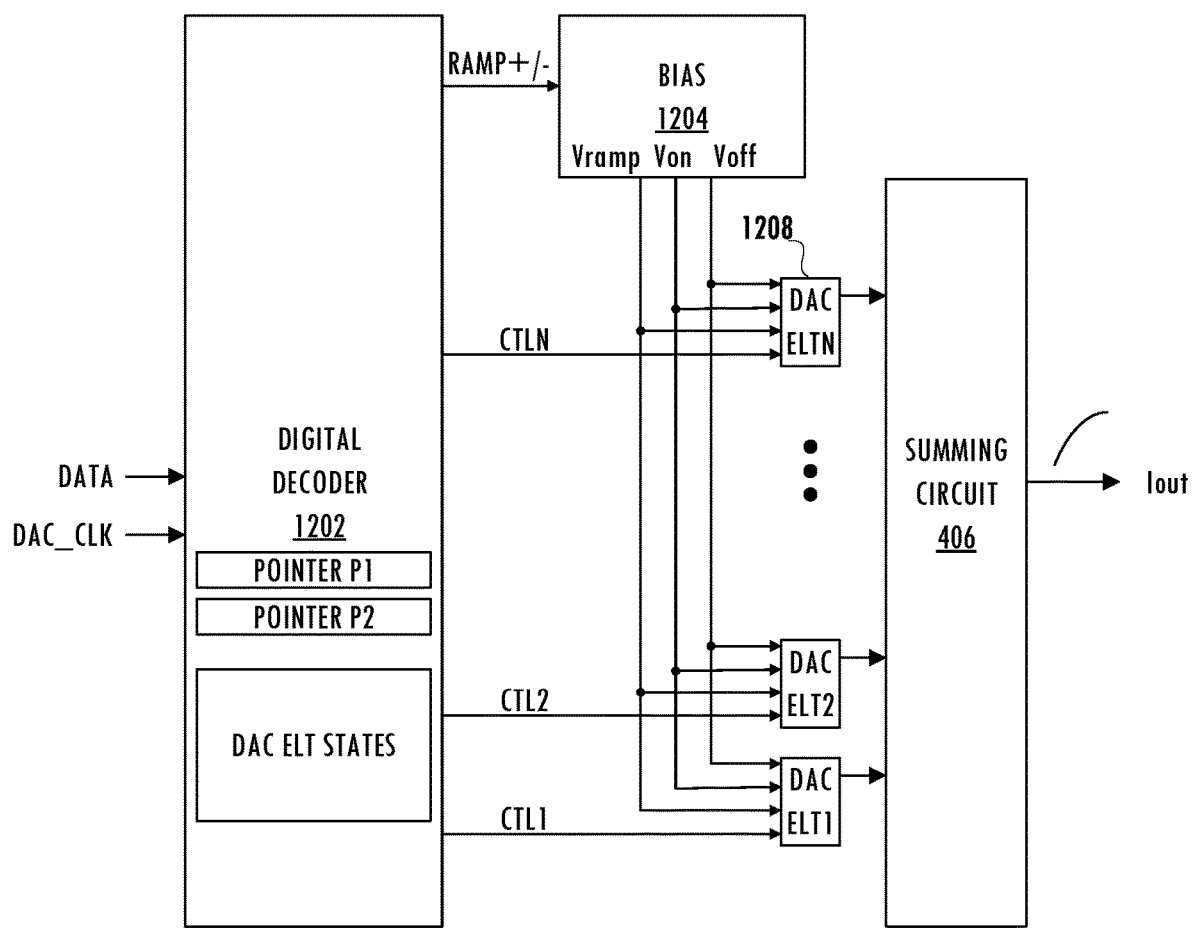
FIG. 14 illustrates a functional block diagram of a current DAC with distributed reconstruction filter consistent with at least one embodiment of the invention.
Figure 15:
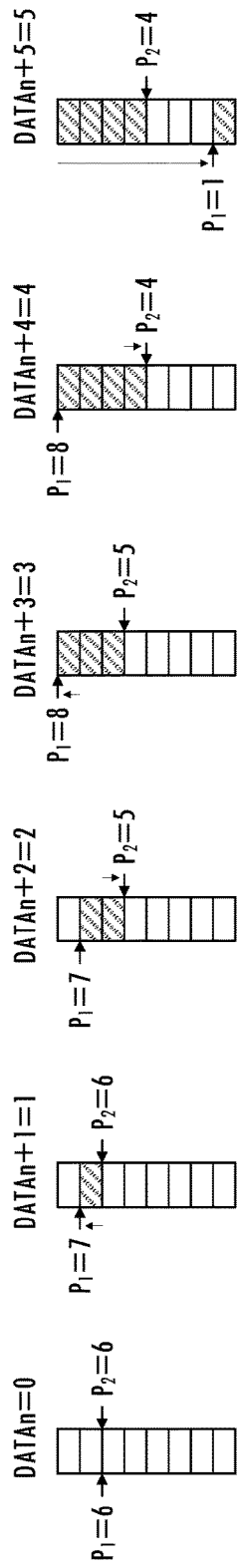
FIGS. 15 and 16 illustrate operation of the digital decoder of the current DAC with distributed reconstruction filter of FIG. 14 consistent with at least one embodiment of the invention.
Figure 18:
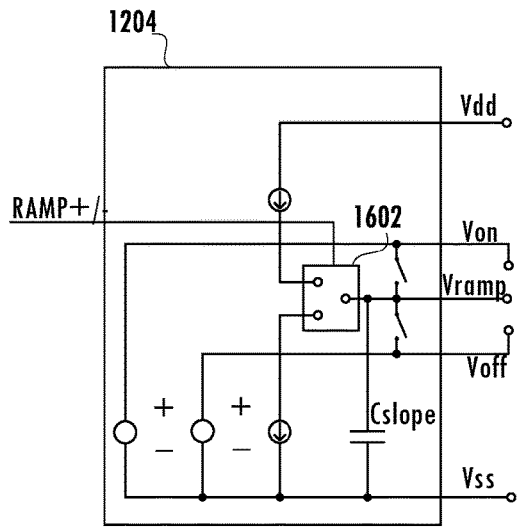
FIG. 18 illustrates a circuit diagram of an exemplary bias circuit of the current DAC with distributed reconstruction filtering of FIG. 14 consistent with at least one embodiment of the invention.

An exemplary bias circuit of current DAC with distributed reconstruction filtering 400 of FIG. 14 is illustrated in FIG. 18. In at least one embodiment, bias circuit 1204 generates predetermined voltage level $V_{ON}$, predetermined voltage level $V_{OFF}$, and transitioning voltage $V_{RAMP}$ based on power supply voltage $V_{DD}$, power supply voltage $V_{SS}$, and control signal RAMP+/−. Select circuit 1602 selects between a sourcing current and a sinking current to provide transitioning voltage $V_{RAMP}$ having a polarity according to control signal $V_{RAMP}$+/−. Capacitor $C_{SLOPE}$ has a size determined according to the frequency of clock signal DAC_CLK and the number of clock periods of a target transitioning voltage $V_{RAMP}$. In at least one embodiment of a current DAC with distributed reconstruction filtering, the linearly transitioning voltage can be provided as an input to each DAC element starting the same change of state at the same cycle of clock signal DAC_CLK and associated circuitry need not be duplicated for each DAC element. Select circuit 1602 in the bias circuit (which in other embodiments may instead be inside the DAC element) selects a positive ramp if elements switch from an off-state to an on-state, or a negative ramp if elements switch from on-state to an off-state.

Figure 19:
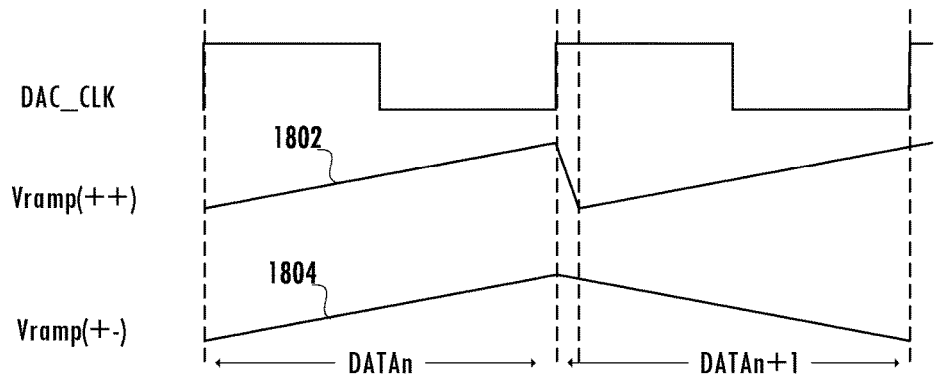
FIG. 19 illustrates waveforms of an exemplary bias circuit of the current DAC with distributed reconstruction filtering of FIG. 14 consistent with at least one embodiment of the invention.

Referring to FIGS. 18 and 19, in an embodiment of a bias circuit that generates only one transitioning voltage signal, the start voltage of transitioning voltage $V_{RAMP}$ depends on the values of digital code DATA. For example, if the value of digital code $DATA_n$ is greater than the value of digital code $DATA_{n-1}$, then the signal level of the analog output signal needs to increase. Accordingly, transitioning voltage $V_{RAMP}$ needs to start from a low voltage level (e.g., $V_{OFF}$). If the value of digital code $DATA_n$ is less than the value of digital code $DATA_{n-1}$, then the signal level of the analog output signal needs to decrease and the transitioning voltage $V_{RAMP}$ needs to start from a high voltage level (e.g., $V_{ON}$). Since capacitor $C_{SLOPE}$ takes time to charge or discharge, an unwanted delay is introduced at the start of the transition when the output of the ramp is the high voltage level and needs to start at a low voltage level for the next value of the digital code DATA, as illustrated by waveform 1802. In contrast, if the output of the transition is the high voltage level and needs to start at the high voltage level for the next transition, then no delay is introduced at the start of the transition, as illustrated by waveform 1804. Thus, start of the transitioning voltage depends on the prior data input and introduces inter-symbol interference, which leads to distortion at the output of the DAC.

Figure 20:
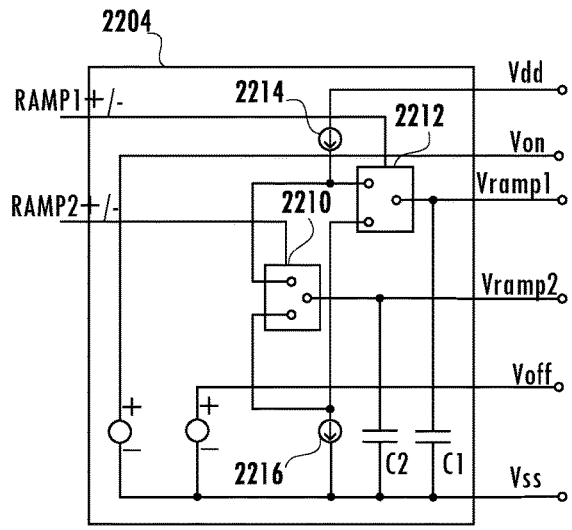
FIG. 20 illustrates a circuit diagram of an exemplary bias circuit of the current DAC with distributed reconstruction filtering of FIG. 14 consistent with at least one embodiment of the invention.
Figure 21:
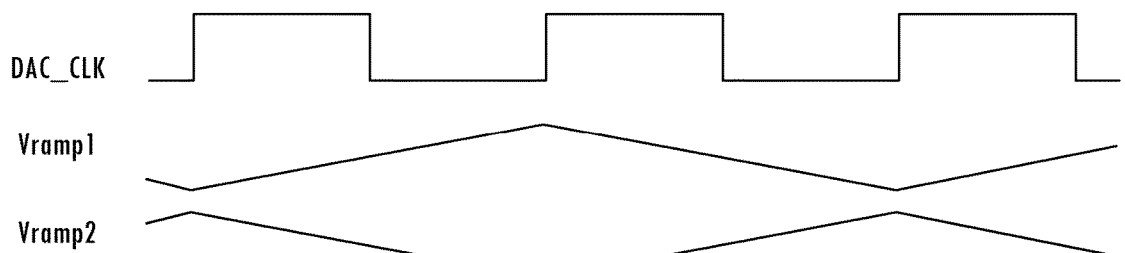
FIG. 21 illustrates exemplary waveforms of the bias circuit of FIG. 20 configured for reduced inter-symbol interference consistent with at least one embodiment of the invention.
Figure 22:
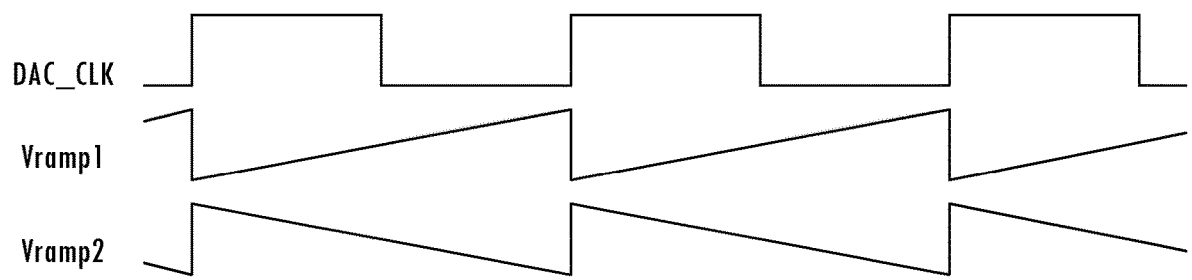
FIG. 22 illustrates exemplary waveforms of another configuration of the bias circuit of FIG. 20 configured for reduced inter-symbol interference consistent with at least one embodiment of the invention.

Referring to FIGS. 20-22, rather than selectively generating the transitioning voltage $V_{RAMP}$ based on a control signal, as described above, an embodiment of a bias circuit separately generates transitioning voltage $V_{RAMP1}$ and transitioning voltage $V_{RAMP2}$, which are out-of-phase with each other, to reduce inter-symbol interference. Bias circuit 2204 includes select circuit 2210 and select circuit 2212, which generate transitioning voltage $V_{RAMP1}$ and transitioning voltage $V_{RAMP2}$, respectively, having a duration of one period of clock signal DAC_CLK. DAC elements that need to be switched on are coupled to transitioning voltage $V_{RAMP1}$ and DAC elements that need to be switched off are coupled to transitioning voltage $V_{RAMP2}$. Alternatively, transitioning voltage $\backslash T_{RAMP1}$ and transitioning voltage $V_{RAMP2}$ can be used as one differential transitioning voltage signal and elements that are being switched on have a non-inverting input terminal and an inverting input terminal that are coupled to transitioning voltage $V_{RAMP1}$ and transitioning voltage $V_{RAMP2}$, respectively, while elements that are being switched off have a non-inverting input terminal and an inverting input terminal that are coupled to transitioning voltage $V_{RAMP2}$ and transitioning voltage $V_{RAMP1}$, respectively. Since capacitor $C_1$ charges while capacitor $C_2$ discharges, bias circuit 2204 of FIG. 20 includes current source 2214 and current sink 2216, which are shared by capacitor $C_1$ and capacitor $C_2$. However, in other embodiments, bias circuit 2204 includes a separate current source and a separate current sink for each capacitor.

FIG. 21 illustrates operation of bias circuit 2204 that uses two phases for charging and discharging in alternate cycles of clock signal DAC_CLK, thus simplifying the analog circuit design, but increasing complexity in the digital decoder for selecting the correct phase. The charge and discharge times of the capacitor in bias circuit 2204 are equal. FIG. 22 illustrates control of bias circuit 2204 that discharges a capacitor or charges a capacitor prior to starting the transition and always provides the same signal for turning on DAC elements and provides another signal dedicated to turning off DAC elements. This embodiment simplifies selection of the phases by the digital decoder. If the transitioning voltage takes two periods of clock signal DAC_CLK then the number of transitioning voltage signals needed increases to four. For example, one or more bias circuits provide a pair of transitioning voltage signals for digital code $DATA_n$ and another pair of transitioning voltage signals out of phase with the first pair of transitioning voltage signals for digital code $DATA_{n+1}$.

Figure 23:
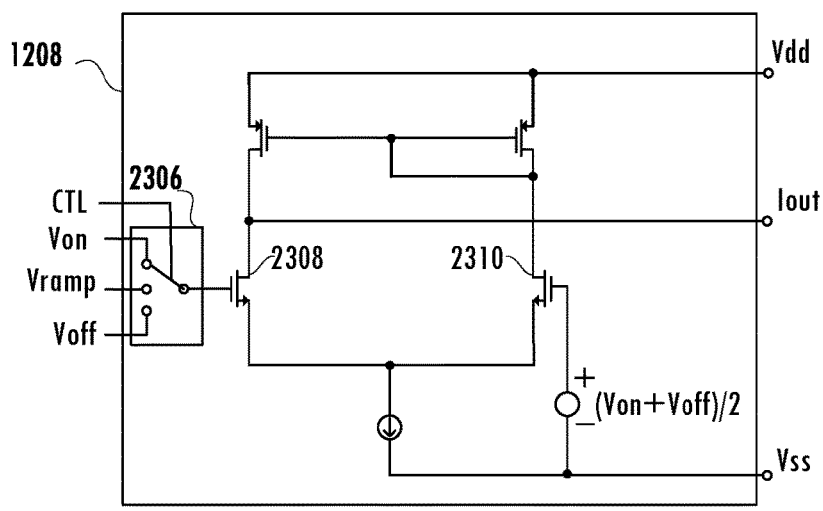
FIG. 23 illustrates a circuit diagram of an exemplary second-order DAC element for use in the current DAC with distributed reconstruction filter of FIG. 14 consistent with at least one embodiment of the invention.
Figure 24:
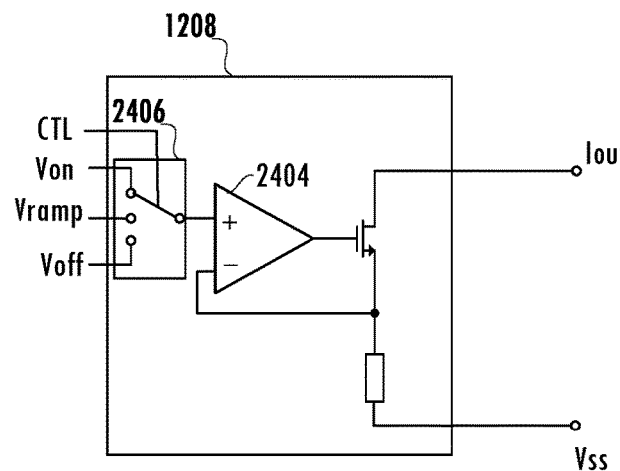
FIG. 24 illustrates a circuit diagram of an exemplary first-order DAC element for use in the current DAC with distributed reconstruction filter of FIG. 14 consistent with at least one embodiment of the invention.

Bias circuit 2204 provides bias signals to a DAC element that selects one of the bias signals for use by the DAC element based on control signal CTL, which includes multiple bits. Select circuit 2306 provides the selected bias signal for use by a DAC element, e.g., as an input to an amplifier in the DAC element, thereby combining the current digital-to-analog conversion and the low-pass filtering functions. An exemplary second-order DAC element including a differential amplifier having transistor 2308 and transistor 2310 configured as a differential pair of transistors is illustrated in FIG. 23. DAC element 1208 includes select circuit 2306 coupled to an input of the differential amplifier to form an exemplary second-order circuit. FIG. 24 illustrates DAC element 1208 that includes an exemplary first-order DAC element. Transconductance amplifier 2404 converts a linear input voltage into a linear current. Select circuit 2406 is inside DAC element 1208 and selects between the off-voltage if the DAC element state remains off, the on-voltage if the DAC element state remains on, or a voltage ramp if the DAC element changes state as an input to transconductance amplifier 2404.

Figure 25:
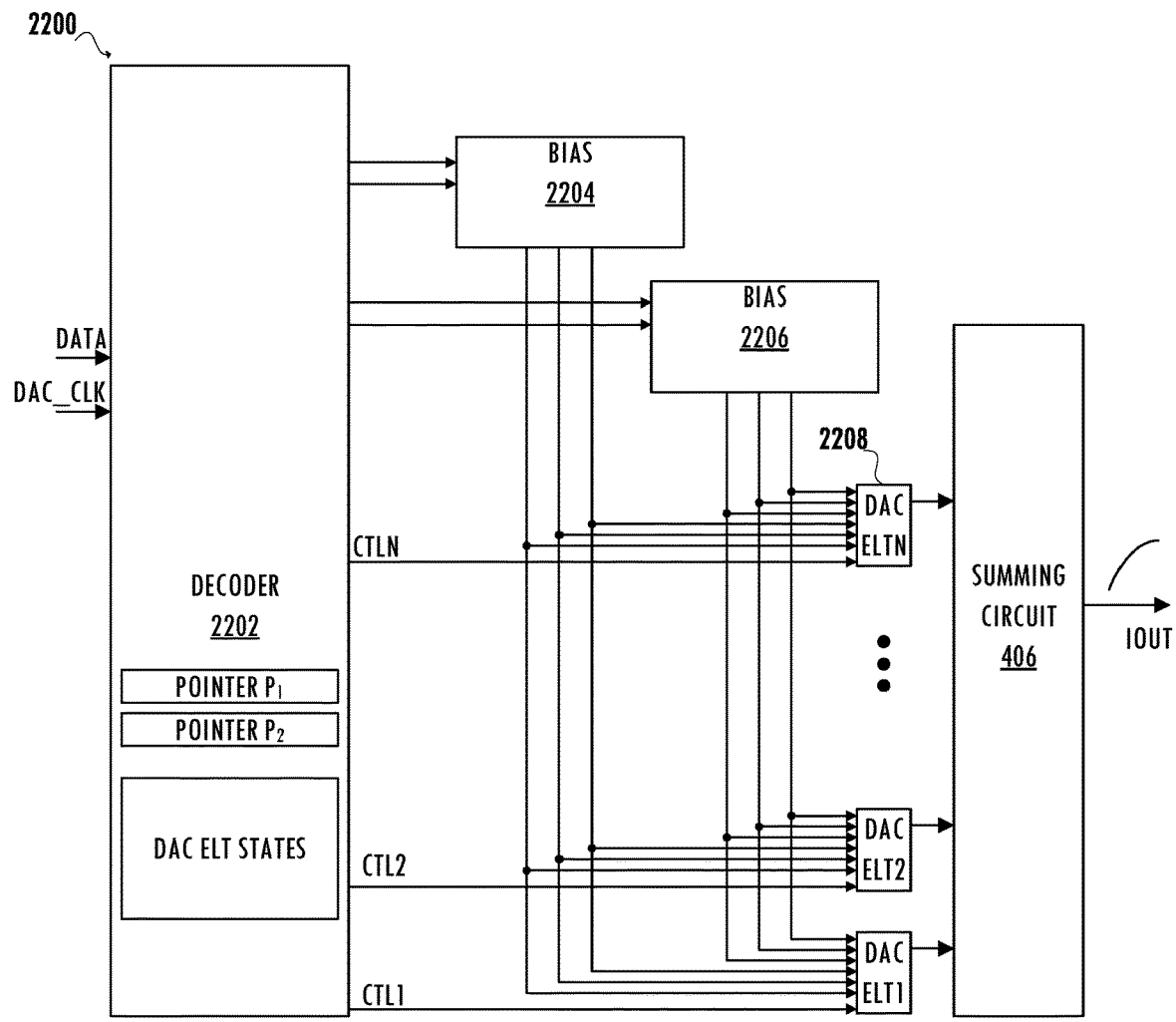
FIG. 25 illustrates a functional block diagram of a current DAC with distributed reconstruction filter including multiple bias circuits consistent with at least one embodiment of the invention.
Figure 26:
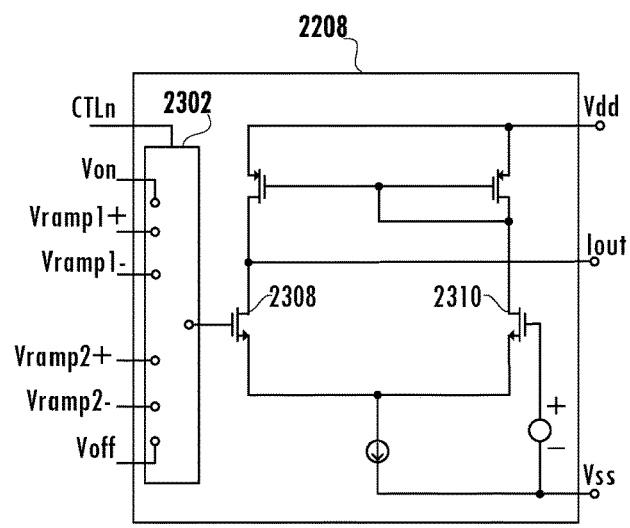
FIG. 26 illustrates a circuit diagram of an exemplary DAC element having an interface responsive to multiple ramp signals in the current DAC with distributed reconstruction filter of FIG. 25 consistent with at least one embodiment of the invention.

In general, a DAC converter with distributed reconstruction filtering requires an additional pair of transitioning voltage signals for each period of clock signal DAC_CLK greater than one of a predetermined number of periods of clock signal DAC_CLK required for the voltage transition. In at least one embodiment, the predetermined number of periods of clock signal DAC_CLK equals two and two bias circuits are used. The predetermined number of periods determines the location of zeros introduced into the frequency response of the current DAC by the distributed reconstruction filtering. FIGS. 25 and 26 illustrate current DAC with distributed reconstruction filtering 2200 that uses a transitioning voltage $V_{RAMP}$ that transitions over two periods of clock signal DAC_CLK to introduce zeros at appropriate locations in the frequency response of the current DAC with reconstruction filtering. Since the transitions are smoother and distributed over multiple clock cycles, the on/off timing of the DAC elements is relaxed. To implement that transition over two periods of clock signal DAC_CLK and guarantee that a DAC element does not change state more frequently than two periods of clock signal DAC- _CLK, current DAC with distributed reconstruction filtering 2200 includes two bias circuits that operate out of phase to provide appropriate bias signals to DAC elements 2208.

In at least one embodiment, DAC elements 2208 receive bias signals from bias circuit 2204 and bias circuit 2206, which operate out of phase with each other. For example, bias circuit 2204 provides a first transitioning voltage (rising or falling) that starts at time n and reaches the predetermined voltage level at the end of cycle n+1. Bias circuit 2206 provides a second ramp (rising or falling) that is out of phase with the first ramp, starts at time n+1, and reaches the predetermined voltage level at the end of cycle n+2. Select circuit 2302 provides transitioning voltage $V_{RAMP1}$ (rising or falling), transitioning voltage $V_{RAMP2}$ (rising or falling), predetermined voltage $V_{ON1}$, predetermined voltage $V_{OFF1}$, predetermined voltage $V_{ON2}$, or predetermined voltage $V_{OFF2}$ as the input of a differential amplifier according to control signal CTLn. Note that in at least one embodiment, $V_{ON1} = V_{ON2} = V_{ON}$ and $V_{OFF1} = V_{OFF2} = V_{OFF}$, and a single bias circuit provides transitioning voltage $V_{RAMP1}$, transitioning voltage $V_{RAMP2}$, predetermined voltage $V_{ON}$, and predetermined voltage $V_{OFF}$ to DAC element 2208, and select circuit 2302 is a 4:1 select circuit controlled by a corresponding control signal CTLn (e.g., a 2-bit control signal) instead of a 6:1 select circuit controlled by a corresponding control signal CTLn (e.g., a 3-bit control signal).

Figure 27:
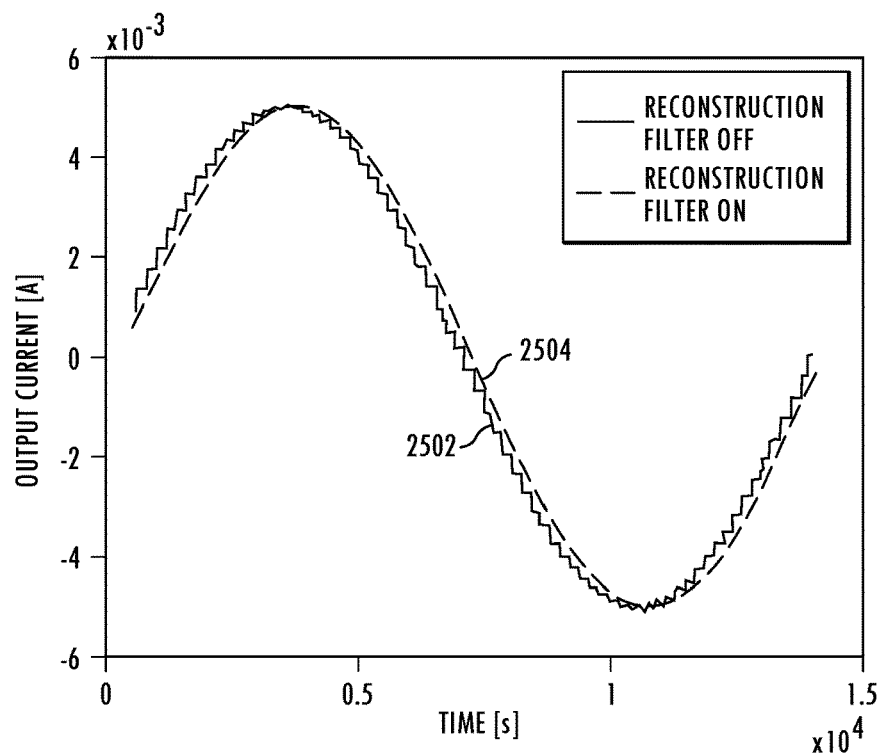
FIG. 27 illustrates waveforms for output current as a function of time for an exemplary 8-bit current DAC with distributed reconstruction filtering consistent with at least one embodiment of the invention and for an 8-bit current DAC without distributed reconstruction filtering.
Figure 28:
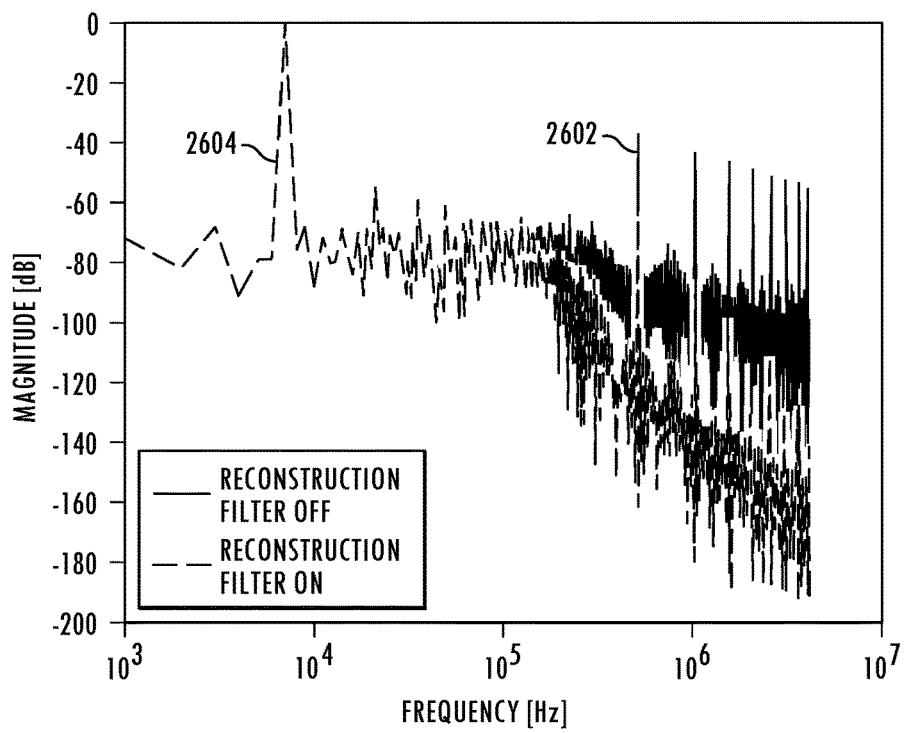
FIG. 28 illustrates frequency response waveforms for an exemplary 8-bit current DAC with distributed reconstruction filtering consistent with at least one embodiment of the invention and for an 8-bit current DAC without distributed reconstruction filtering.

Waveform 2502 of FIG. 27 illustrates output current as a function of time for an exemplary 8-bit current DAC including 256 DAC elements without a distributed reconstruction filtering. Waveform 2504, which is smoother than waveform 2502, illustrates the output current as a function of time for the exemplary 8-bit current DAC including 256 DAC elements with the distributed reconstruction filtering. Waveform 2602 and waveform 2604 of FIG. 27 illustrate the output current as a function of frequency for an exemplary 8-bit current DAC including 256 DAC elements without distributed reconstruction filtering and for the exemplary 8-bit current DAC including 256 DAC elements with distributed reconstruction filtering, respectively. Waveform 2602 includes higher harmonics of clock signal DAC_CLK while those harmonics are substantially attenuated in waveform 2604. Note that the distributed reconstruction filtering introduces notches at multiple frequencies. The locations of the notches can be adjusted by changing the slope of the transition voltage (e.g., by changing the number of cycles of clock signal DAC_CLK that it takes for a transition of voltage transitioning voltage $V_{RAMP}$ from predetermined voltage $V_{ON}$ to predetermined voltage $V_{OFF}$ or predetermined voltage $V_{OFF}$ to predetermined voltage $V_{ON}$, as the case may be).

In at least one embodiment, a method for digital-to-analog signal conversion with distributed reconstruction filtering includes receiving a digital code synchronous to a clock signal having a first frequency. The method includes determining next states of a plurality of digital-to-analog current elements based on the digital code and combining a plurality of currents to generate an output current. The method includes generating the plurality of currents, each current of the plurality of currents being based on a corresponding control signal of a plurality of control signals. The method includes generating the plurality of control signals based on the next states of the plurality of digital-to-analog current elements. Each control signal of the plurality of control signals selects a first predetermined voltage level, a second predetermined voltage level, or a transitioning voltage level for use by a corresponding digital-to-analog current element of the plurality of digital-to-analog current elements. The transitioning voltage level linearly transitions from the first predetermined voltage level to the second predetermined voltage level over a predetermined number of periods of the clock signal.

In an embodiment of the method, a frequency response of the digital-to-analog signal conversion includes a zero at a second frequency based on the first frequency and the predetermined number of periods of the clock signal.

In an embodiment of the method, the predetermined number of periods of the clock signal equals two and the zero occurs at a harmonic of the first frequency.

In an embodiment of the method, generating the plurality of control signals includes generating a control signal of the plurality of control signals that selects a bias signal that linearly transitions over the predetermined number of periods of the clock signal from a first voltage level associated with a first state of a digital-to-analog current element of the plurality of digital-to-analog current elements to a second voltage level associated with a second state of the digital-to-analog current element in response to a next state of the digital-to-analog current element being different from a present state of the digital-to-analog current element.

In an embodiment of the method, generating the plurality of control signals includes generating a control signal of the plurality of control signals that selects a voltage level of a bias signal used by a digital-to-analog current element of the plurality of digital-to-analog current elements in a next state of the digital-to-analog current element to be the same voltage level used by the digital-to-analog current element in a present state of the digital-to-analog current element in response to the next state of the digital-to-analog current element being the same as the present state of the digital-to-analog current element.

In an embodiment of the method, determining the next states of the plurality of digital-to-analog current elements includes updating a first pointer in response to a first sample in a sequence of digital samples and updating a second pointer in response to a next sample in the sequence of digital samples. The first pointer corresponds to a first index to the plurality of digital-to-analog current elements. The second pointer corresponds to a second index to the plurality of digital-to-analog current elements.

In an embodiment of the method, updating the first pointer includes increasing the first pointer in response to the first sample being greater than an immediately prior sample in the sequence of digital samples and decreasing the first pointer in response to the first sample being less than the immediately prior sample. Updating the second pointer includes increasing the second pointer in response to the next sample being greater than the first sample and decreasing the second pointer in response to the next sample being less than the first sample.

In an embodiment of the method, determining the next states of the plurality of digital-to-analog current elements includes setting a next state for each digital-to-analog current element of the plurality of digital-to-analog current elements indexed below a first value of the first pointer and above a second value of the second pointer, modulo N, and resetting the next state for each other digital-to-analog current element of the plurality of digital-to-analog current elements. N is an integer number of digital-to-analog current elements in the plurality of digital-to-analog current elements.

In at least one embodiment, a DAC with distributed reconstruction filtering includes a bias circuit configured to provide a first predetermined voltage level as a first output of the bias circuit, a second predetermined voltage level as a second output of the bias circuit, or a transitioning voltage level as a third output of the bias circuit. The transitioning voltage level linearly transitions from the first predetermined voltage level to the second predetermined voltage level over a predetermined number of periods of a clock signal having a first frequency. The DAC with distributed reconstruction filtering includes a plurality of digital-to-analog current elements configured to generate a plurality of currents. Each current of the plurality of currents is generated by a corresponding digital-to-analog current element of the plurality of digital-to-analog current elements according to a corresponding control signal of a plurality of control signals. The DAC with distributed reconstruction filtering includes a combiner circuit configured to combine the plurality of currents to generate an output current. The DAC with distributed reconstruction filtering includes a decoder circuit configured to determine next states of the plurality of digital-to-analog current elements based on a digital code received synchronously to the clock signal, and to generate the plurality of control signals based on the next states of the plurality of digital-to-analog current elements. Each control signal of the plurality of control signals selects the first predetermined voltage level, the second predetermined voltage level, or the transitioning voltage level for use by the corresponding digital-to-analog current element.

In an embodiment of the DAC with distributed reconstruction filtering, each digital-to-analog current element of the plurality of digital-to-analog current elements includes a differential pair of transistors selectively coupled to the first output of the bias circuit, the second output of the bias circuit, or the third output of the bias circuit according to the corresponding control signal of the plurality of control signals.

In an embodiment of the DAC with distributed reconstruction filtering, each digital-to-analog current element of the plurality of digital-to-analog current elements includes an amplifier and a switch configured to selectively couple an input of the amplifier to the first output of the bias circuit, the second output of the bias circuit, or the third output of the bias circuit according to the corresponding control signal of the plurality of control signals.

In an embodiment, the DAC with distributed reconstruction filtering includes an additional instantiation of the bias circuit for each period greater than one of the predetermined number of periods of the clock signal.

In an embodiment of the DAC with distributed reconstruction filtering, a frequency response of the DAC with distributed reconstruction filtering includes a zero at a second frequency based on the first frequency and the predetermined number of periods of the clock signal.

In an embodiment of the DAC with distributed reconstruction filtering, the predetermined number of periods of the clock signal equals two and the zero occurs at a harmonic of the first frequency.

In an embodiment of the DAC with distributed reconstruction filtering, the decoder circuit is configured to generate a control signal of the plurality of control signals that selects a bias signal that linearly transitions over the predetermined number of periods of the clock signal from a first voltage level associated with a first state of a digital-to-analog current element of the plurality of digital-to-analog current elements to a second voltage level associated with a second state of the digital-to-analog current element in response to a next state of the digital-to-analog current element being different from a present state of the digital-to-analog current element.

In an embodiment of the DAC with distributed reconstruction filtering, the decoder circuit is configured to generate a control signal of the plurality of control signals that maintains a voltage level of a bias signal used by a digital-to-analog current element of the plurality of digital-to-analog current elements in a next state of the digital-to-analog current element to be the same voltage level used by the digital-to-analog current element in a present state of the digital-to-analog current element in response to the next state of the digital-to-analog current element being the same as the present state of the digital-to-analog current element.

In an embodiment of the DAC with distributed reconstruction filtering, the decoder circuit includes a first pointer configured to update in response to a first sample in a sequence of digital samples and a second pointer configured to update in response to a next sample in the sequence of digital samples. The first pointer corresponds to a first index to the plurality of digital-to-analog current elements. The second pointer corresponds to a second index to the plurality of digital-to-analog current elements.

In an embodiment of the DAC with distributed reconstruction filtering, the decoder circuit is configured to increase the first pointer in response to the first sample being greater than an immediately prior sample in the sequence of digital samples, to decrease the first pointer in response to the first sample being less than the immediately prior sample, to increase the second pointer in response to the next sample being greater than the first sample, and to decrease the second pointer in response to the next sample being less than the first sample.

In an embodiment of the DAC with distributed reconstruction filtering, the decoder circuit is configured to set a next state for each digital-to-analog current element of the plurality of digital-to-analog current elements indexed below a first value of the first pointer and above a second value of the second pointer, modulo N, and to reset the next state for each other digital-to-analog current element of the plurality of digital-to-analog current elements. N is an integer number of digital-to-analog current elements in the plurality of digital-to-analog current elements.

Thus, techniques for converting a sequence of digital codes into corresponding currents using distributed reconstruction filtering have been disclosed. Although the invention is described herein with reference to specific embodiments, various modifications and changes can be made without departing from the scope of the present invention as set forth in the claims below. For example, although specific numbers and structures of current DAC elements are described, other numbers and structures of current DAC elements may be used. In addition, although the current DAC is described DAC elements generating current having equal weight, in other embodiments, the techniques described herein are adapted to a current DAC with distributed reconstruction filtering including DAC elements that provide signals having other weightings (e.g., binary-weighted). Furthermore, the techniques described herein are adapted to other architectures of a current DAC with distributed reconstruction filtering, e.g., a current DAC with distributed reconstruction filtering including coarse DAC elements and fine DAC elements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for digital-to-analog signal conversion with distributed reconstructive filtering, the method comprising:
   receiving a digital code synchronous to a clock signal having a first frequency;
   determining next states of a plurality of digital-to-analog current elements based on the digital code;
   combining a plurality of currents to generate an output current;
   generating the plurality of currents, each current of the plurality of currents being based on a corresponding control signal of a plurality of control signals; and
   generating the plurality of control signals based on the next states of the plurality of digital-to-analog current elements, each control signal of the plurality of control signals selecting a first predetermined voltage level, a second predetermined voltage level, or a transitioning voltage level for use by a corresponding digital-to-analog current element of the plurality of digital-to-analog current elements, the transitioning voltage level linearly transitioning from the first predetermined voltage level to the second predetermined voltage level over a predetermined number of periods of the clock signal.

2. The method as recited in claim 1 wherein a frequency response of the digital-to-analog signal conversion includes a zero at a second frequency based on the first frequency and the predetermined number of periods of the clock signal.

3. The method as recited in claim 2 wherein the predetermined number of periods of the clock signal equals two and the zero occurs at a harmonic of the first frequency.

4. The method as recited in claim 1 wherein generating the plurality of control signals comprises generating a control signal of the plurality of control signals that selects a bias signal that linearly transitions over the predetermined number of periods of the clock signal from a first voltage level associated with a first state of a digital-to-analog current element of the plurality of digital-to-analog current elements to a second voltage level associated with a second state of the digital-to-analog current element in response to a next state of the digital-to-analog current element being different from a present state of the digital-to-analog current element.

5. The method as recited in claim 1 wherein generating the plurality of control signals comprises generating a control signal of the plurality of control signals that selects a voltage level of a bias signal used by a digital-to-analog current element of the plurality of digital-to-analog current elements in a next state of the digital-to-analog current element to be the same voltage level used by the digital-to-analog current element in a present state of the digital-to-analog current element in response to the next state of the digital-to-analog current element being the same as the present state of the digital-to-analog current element.

6. The method as recited in claim 1 wherein determining the next states of the plurality of digital-to-analog current elements comprises:
   updating a first pointer in response to a first sample in a sequence of digital samples, the first pointer corresponding to a first index to the plurality of digital-to-analog current elements; and
   updating a second pointer in response to a next sample in the sequence of digital samples, the second pointer corresponding to a second index to the plurality of digital-to-analog current elements.

7. The method as recited in claim 6,
   wherein updating the first pointer includes increasing the first pointer in response to the first sample being greater than an immediately prior sample in the sequence of digital samples and decreasing the first pointer in response to the first sample being less than the immediately prior sample, and
   wherein updating the second pointer includes increasing the second pointer in response to the next sample being greater than the first sample and decreasing the second pointer in response to the next sample being less than the first sample.

8. The method as recited in claim 6 wherein determining the next states of the plurality of digital-to-analog current elements comprises:
   setting a next state for each digital-to-analog current element of the plurality of digital-to-analog current elements indexed below a first value of the first pointer and above a second value of the second pointer, modulo N, where N is an integer number of digital-to-analog current elements in the plurality of digital-to-analog current elements; and
   resetting the next state for each other digital-to-analog current element of the plurality of digital-to-analog current elements.

9. A digital-to-analog converter providing distributed reconstruction filtering, the digital-to-analog converter comprising:
   a bias circuit configured to provide a first predetermined voltage level as a first output of the bias circuit, a second predetermined voltage level as a second output of the bias circuit, or a transitioning voltage level as a third output of the bias circuit, the transitioning voltage level linearly transitioning from the first predetermined voltage level to the second predetermined voltage level over a predetermined number of periods of a clock signal having a first frequency;
   a plurality of digital-to-analog current elements configured to generate a plurality of currents, each current of the plurality of currents being generated by a corresponding digital-to-analog current element of the plurality of digital-to-analog current elements according to a corresponding control signal of a plurality of control signals;
   a combiner circuit configured to combine the plurality of currents to generate an output current; and
   a decoder circuit configured to determine next states of the plurality of digital-to-analog current elements based on a digital code received synchronously to the clock signal and to generate the plurality of control signals based on the next states of the plurality of digital-to-analog current elements, each control signal of the plurality of control signals selecting the first predetermined voltage level, the second predetermined voltage level, or the transitioning voltage level for use by the corresponding digital-to-analog current element.

10. The digital-to-analog converter with distributed reconstruction filtering as recited in claim 9 wherein each digital-to-analog current element of the plurality of digital-to-analog current elements comprises a differential pair of transistors selectively coupled to the first output of the bias circuit, the second output of the bias circuit, or the third output of the bias circuit according to the corresponding control signal of the plurality of control signals.

11. The digital-to-analog converter with distributed reconstruction filtering as recited in claim 9 wherein each digital-to-analog current element of the plurality of digital-to-analog current elements comprises:
   an amplifier; and
   a switch configured to selectively couple an input of the amplifier to the first output of the bias circuit, the second output of the bias circuit, or the third output of the bias circuit according to the corresponding control signal of the plurality of control signals.

12. The digital-to-analog converter with distributed reconstruction filtering as recited in claim 9 further comprising:
   an additional instantiation of the bias circuit for each period greater than one of the predetermined number of periods of the clock signal.

13. The digital-to-analog converter with distributed reconstruction filtering as recited in claim 9 wherein a frequency response of the digital-to-analog converter with distributed reconstruction filtering includes a zero at a second frequency based on the first frequency and the predetermined number of periods of the clock signal.

14. The digital-to-analog converter with distributed reconstruction filtering as recited in claim 13 wherein the predetermined number of periods of the clock signal equals two and the zero occurs at a harmonic of the first frequency.

15. The digital-to-analog converter with distributed reconstruction filtering as recited in claim 9 wherein the decoder circuit is configured to generate a control signal of the plurality of control signals that selects a bias signal that linearly transitions over the predetermined number of periods of the clock signal from a first voltage level associated with a first state of a digital-to-analog current element of the plurality of digital-to-analog current elements to a second voltage level associated with a second state of the digital-to-analog current element in response to a next state of the digital-to-analog current element being different from a present state of the digital-to-analog current element.

16. The digital-to-analog converter with distributed reconstruction filtering as recited in claim 9 wherein the decoder circuit is configured to generate a control signal of the plurality of control signals that maintains a voltage level of a bias signal used by a digital-to-analog current element of the plurality of digital-to-analog current elements in a next state of the digital-to-analog current element to be the same voltage level used by the digital-to-analog current element in a present state of the digital-to-analog current element in response to the next state of the digital-to-analog current element being the same as the present state of the digital-to-analog current element.

17. The digital-to-analog converter with distributed reconstruction filtering as recited in claim 9 wherein the decoder circuit comprises:
   a first pointer configured to update in response to a first sample in a sequence of digital samples, the first pointer corresponding to a first index to the plurality of digital-to-analog current elements; and
   a second pointer configured to update in response to a next sample in the sequence of digital samples, the second pointer corresponding to a second index to the plurality of digital-to-analog current elements.

18. The digital-to-analog converter with distributed reconstruction filtering as recited in claim 17 wherein the decoder circuit is configured to increase the first pointer in response to the first sample being greater than an immediately prior sample in the sequence of digital samples and decrease the first pointer in response to the first sample being less than the immediately prior sample, increase the second pointer in response to the next sample being greater than the first sample, and decrease the second pointer in response to the next sample being less than the first sample.

19. The digital-to-analog converter with distributed reconstruction filtering as recited in claim 17 wherein the decoder circuit is configured to set a next state for each digital-to-analog current element of the plurality of digital-to-analog current elements indexed below a first value of the first pointer and above a second value of the second pointer, modulo N, where N is an integer number of digital-to-analog current elements in the plurality of digital-to-analog current elements, and to reset the next state for each other digital-to-analog current element of the plurality of digital-to-analog current elements.

20. An apparatus comprising:
   means for generating an output current using a plurality of currents, each current of the plurality of currents being generated based on a corresponding control signal of a plurality of control signals; and
   means for generating the plurality of control signals, each control signal of the plurality of control signals selecting a first predetermined voltage level, a second predetermined voltage level, or a transitioning voltage level for use by the means for generating the output current, the transitioning voltage level linearly transitioning from the first predetermined voltage level to the second predetermined voltage level over a predetermined number of periods of a clock signal, thereby suppressing high frequency signal components in the output current.

\* \* \* \* \*